United States Patent [19]

Tseng et al.

[11] Patent Number: 5,837,426
[45] Date of Patent: Nov. 17, 1998

[54] PHOTOLITHOGRAPHIC PROCESS FOR MASK PROGRAMMING OF READ-ONLY MEMORY DEVICES

[75] Inventors: Che-Pin Tseng, Hsinchu; Wei-Jiang Lin, Yungho; Wen-Cheng Tien, Taipei; Yun-Kuei Yang, Tai Chung, all of Taiwan

[73] Assignee: United Microelectronics Corp., Hsinchu, Taiwan

[21] Appl. No.: 712,406

[22] Filed: Sep. 11, 1996

[30]     Foreign Application Priority Data

Jul. 29, 1996 [TW] Taiwan ................................. 85109208

[51] Int. Cl.⁶ ....................................................... G03F 7/20
[52] U.S. Cl. ........................... 430/311; 430/394; 430/396
[58] Field of Search ..................................... 430/311, 322, 430/394, 396

[56]          References Cited

U.S. PATENT DOCUMENTS 5,134,058  7/1992  Han ......................................... 430/394

FOREIGN PATENT DOCUMENTS 1-107527  4/1989  Japan ..................................... 430/394
3-1522    1/1991  Japan ..................................... 430/394

Primary Examiner—Kathleen Duda
Attorney, Agent, or Firm—Rabin & Champagne, P.C.

[57]             ABSTRACT

A photolithographic process which provides reduced line widths or reduced inter-element line spaces for the circuit elements on an IC chip, allowing the IC chip to have a higher degree of integration. The photolithographic process includes a double-exposure process on the same wafer defined by placing either the same photomask at two different positions or by using two photomasks. In the first exposure process, a first selected set of areas on the photoresist layer is exposed through the photomask. In the second exposure process, the photomask is shifted to predetermined positions interleaving or overlapping the positions where the first selected set of exposed areas are formed, or alternatively a second photomask replaces the first photomask. The second photomask has a plurality of patterns arranged in positions correspondingly interleaving or overlapping the positions where the first selected set of exposed areas is formed. The exposure light then illuminates the wafer again so as to expose a second selected set of areas on the photoresist layer. The first and second selected sets of exposed areas in combination constitute a layout for the circuit elements which are to be subsequently formed. Through the photolithographic process, the circuit elements are doubled in density compared with the corresponding patterns on the photomask and can be formed with a reduced line width or inter-element space.

6 Claims, 2 Drawing Sheets

PHOTOLITHOGRAPHIC PROCESS FOR MASK PROGRAMMING OF READ-ONLY MEMORY DEVICES

BACKGROUND OF THE INVENTION

1. Field of the Invention

The invention relates to semiconductor fabrication processes, and more particularly, to a photolithographic process for transferring photomask patterns onto an IC chip in, for example, a mask programming process for a read-only memory (ROM) device. The photolithographic process according to the invention provides for reduction of line widths or spaces of circuit elements defined on the IC chip to be reduced so as to increase the integration density thereof.

2. Description of the Related Art

A photolithographic process is a vital step in the fabrication of a semiconductor device such as a MOS (metal-oxide semiconductor) device. The circuit layout of metallization layers and diffusion areas on a MOS device is defined by photolithographic processes. In a photolithographic process, an exposure light, usually ultraviolet (UV) light, is used to expose a photoresist-coated semiconductor wafer through a mask (hereinafter referred to as a photomask). The purpose of the photolithographic process is to transfer a set of patterns representative of the circuit layout onto the wafer. The patterns on the photomask define the positions, shapes, and sizes of various circuit elements such as diffusion areas, metal contacts, and metallization layers, on the wafer.

In a photolithographic process, the resolution R of the image projected by the exposure light through the photomask on the wafer is related to the wavelength $\lambda$ of the exposure light such that:

$$R = \frac{K_1 \cdot \lambda}{NA} \quad (1)$$

where $K_1$ is a constant factor related to the photoresist layer; and

NA is the numerical aperture of an optical system used by a stepper to focus the exposure light on the wafer.

It can be learned from Eq. (1) that exposure light having a shorter wavelength will provide a sharper resolution. Since the purpose of the photolithographic process is to transfer the photomask patterns onto a photoresist layer which typically has a thickness of about 1 $\mu$m, the image projected by the photomask on the photoresist layer should have a large enough depth of field to include the entire thickness of the photoresist layer. In other words, the image projected on the photoresist layer should be sharp on both the top and bottom surfaces of the photoresist layer. The depth of focus DOF is defined by the following relationship:

$$DOF = \frac{K_2 \cdot \lambda}{(NA)^2} \quad (2)$$

where $K_2$ is another constant factor related to the photoresist layer.

From Eq. (2), it is apparent that, to increase the depth of field, the exposure light should have a wavelength as large as possible. However, the use of exposure light having a large wavelength will correspondingly reduce the resolution of the projected image. Therefore, in conventional stepper design, a tradeoff for wavelength must be made between resolution and depth of field. This is also true for the numerical aperture NA of the stepper.

In conventional photolithographic processes, the exposure light is either g-line UV light having a wavelength of 4,360 Å (angstroms) or i-line UV light having a wavelength of 3,650 Å, and NA=0.5, $K_1$=0.65, and $K_2$=1.0. Accordingly, in the case of using g-line UV light as the exposure light, R=0.47 $\mu$m and DOF=1.46 $\mu$m. However, since the next-generation 64 Mbit DRAM requires that R$\leq$0.35 $\mu$m and DOF$\geq$1.46 $\mu$m, UV light with a shorter wavelength should be utilized, such as the deep ultra-violet light from a krypton fluoride (KrF) laser, which has a wavelength of 2,480 Å.

FIG. 1 is a plan view of a photomask 10, which is an opaque sheet having a pattern of transparent portions 12 that allows the exposure light to pass through to a photoresist layer (not shown) coated on a wafer. This allows the pattern 12 on the photomask 10 to be projected and thus transferred onto the photoresist layer by the exposure light. The photoresist layer can be either of a positive conductivity type or a negative conductivity type. For a negative conductivity type of photoresist layer, the part of the photoresist layer exposed by the transparent pattern 12 will remain on the wafer while the unexposed part will be removed after development; whereas for a positive conductivity type of photoresist layer, the part of the photoresist layer unexposed by the transparent pattern 12 will remain on the wafer while the exposed part will be removed.

Referring next to FIG. 2, the transparent pattern 12 on the photomask 10 is used to define the positions, shapes, and sizes of a plurality of metallization layers 14a, 14b, 14c, 14d on a ROM device for mask programming of that ROM device. Utilizing a conventional photolithographic process, the minimum width achievable for each of these metallization layers 14a, 14b, 14c, 14d is about 4 $\mu$m. Due to this size constraint, this conventional photolithographic process allows only two metallization layers, i.e., 14a and 14b, to be formed on a BN$^+$area 15 in the wafer. Restricted by the factors of resolution and depth of field described above, the integration of more metallization layers on the BN$^+$area 15 is unattainable unless by employing more advanced photolithographic equipment. However, this approach is quite costly to implement. There is, therefore, a need for a new photolithographic process which can provide for an increased density of metallization layers to be formed on the BN$^+$area 15 of the IC device of FIG. 1. Feasible approaches include reducing either the line width of the metallization layers or the space between the same.

SUMMARY OF THE INVENTION

It is therefore an objective of the invention to provide a photolithographic process which can increase the degree of integration of circuit elements on an IC chip.

It is another objective of the invention to provide a photolithographic process which provides for the reduction of the line width of the circuit elements on an IC chip.

It is still another objective of the invention to provide a photolithographic process which provides for the reduction of the line space between the circuit elements on an IC chip.

In accordance with the foregoing and other objectives of the invention, a new and improved photolithographic process is provided. The photolithographic process according to the invention includes a double-exposure process performed on the same wafer either by placing the same photomask at two different positions or by using two photomasks. There are two preferred embodiments of the photolithographic process according to the invention.

In the first preferred embodiment, a first step is to form a photoresist layer over the IC chip. A second step is to cover the photoresist layer with a photomask. The photomask is an opaque sheet having a plurality of transparent portions forming a pattern thereon. A third step is to perform a first exposure process by illuminating the photoresist layer through the photomask so as to expose a first selected set of areas on the photoresist layer. Subsequently, a fourth step may be performed in either of two ways. One way is to shift the photomask to a predetermined position such that the transparent pattern interleaves the positions where the first selected set of areas were exposed. The other way is to replace the first photomask with a second photomask. This second photomask also has a plurality of transparent portions arranged in a pattern such that the transparent pattern interleaves the positions where the first selected set of areas were exposed. In a fifth step, a second exposure process is performed on the photoresist layer by illuminating a second selected set of areas on the photoresist layer through the photomask. The first and second selected sets of areas on the photoresist layer in combination form a layout for the circuit elements which are to be later fabricated on the IC chip. In a sixth step, the photoresist layer is developed to remove the unexposed areas if the photoresist layer is of a negative conductivity type, and to remove the exposed areas if the photoresist layer is of a positive conductivity type.

In the second preferred embodiment, a first step is to form a photoresist layer over the IC chip. A second step is to cover the photoresist layer with a photomask. The photomask is an opaque sheet having a plurality of transparent portions forming a pattern thereon. A third step is to perform a first exposure process by illuminating the photoresist layer through the photomask so as to expose a first selected set of areas on the photoresist layer. Subsequently, a fourth step may be performed in either of two ways. One way is to shift the photomask to a predetermined position such that the transparent pattern overlaps the positions where the first selected set of areas were exposed. The other way is to replace the first photomask with a second photomask. This second photomask has a plurality of transparent portions arranged in a pattern such that the transparent pattern overlaps the positions where the first selected set of areas were exposed. In a fifth step, a second exposure process is performed on the photoresist layer by illuminating a second selected set of areas on the photoresist layer overlapping the first selected set of areas through the photomask. The first and second selected sets of areas on the photoresist layer in combination form a layout for the circuit elements which are to be later fabricated on the IC chip. In the sixth step, the photoresist layer is developed to remove the unexposed areas if the photoresist layer is of a negative conductivity type, or the exposed areas if the photoresist layer is of a positive conductivity type.

The remaining portions of the photoresist layer are used as a mask in a subsequent etching process to define the positions, shapes, and sizes of a plurality of circuit elements, such as metallization layers on a mask ROM device. If the photoresist layer is of a negative conductivity type, the remaining portions define a plurality of circuit elements with a reduced space therebetween. If the photoresist layer is of a positive conductivity type, the remaining portions define a plurality of circuit elements with a reduced line width. Through the foregoing process, the circuit elements formed on the wafer can be reduced in line width or space. The degree of integration of the circuit elements on the wafer can thus be increased.

BRIEF DESCRIPTION OF THE DRAWINGS

The invention can be more fully understood by way of the following detailed description of the preferred embodiments, with reference made to the accompanying drawings, wherein.

DETAILED DESCRIPTION OF THE PREFERRED EMBODIMENTS

FIRST EMBODIMENT

Figure 3:
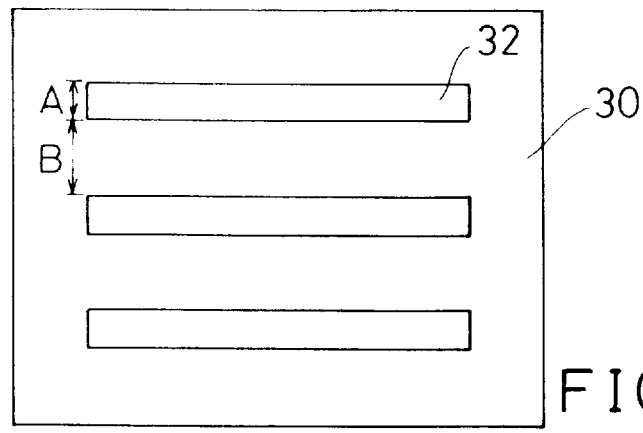
FIG. 3 is a plan view of a photomask utilized in the photolithographic process according to the invention.

Referring to FIG. 3, a photomask 30 having a plurality of elongated transparent portions forming a pattern 32 thereon is shown. Each of the elongated transparent portions 32 has a width A and is spaced from the adjacent portions(s) by a distance B. This photomask 30 is used to transfer the transparent pattern 32 thereon to a photoresist layer 40 as shown in FIG. 4A, in a first exposure process.

Figures 4A, 4B:
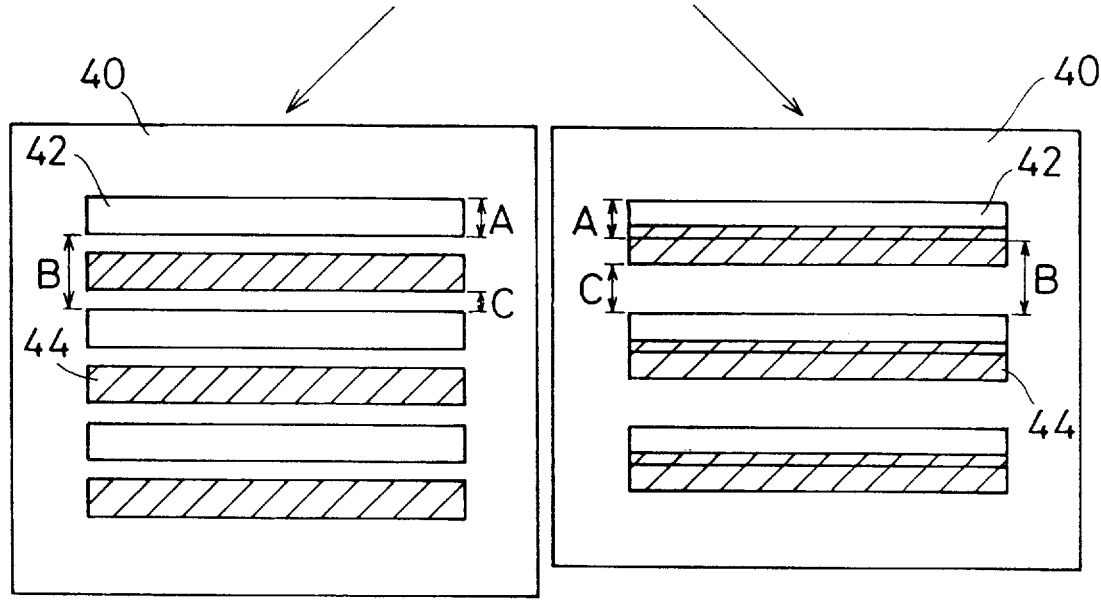
FIG. 4A is a plan view of a photoresist layer having exposed areas defined by a first preferred embodiment of the photolithographic process according to the invention.
FIG. 4B is a plan view of a photoresist layer having exposed areas defined by a second preferred embodiment of the photolithographic process according to the invention.

Referring to FIG. 4A, the unshaded areas 42 represent the first set of exposed areas corresponding to the transparent pattern 32 on the photomask 30. The distance between adjacent exposed areas 42 is B.

In accordance with the invention, there are two ways to perform the second exposure process. One way is to shift the photomask 30 downwards by a predetermined displacement to a position allowing the transparent portions 32 thereon to interleave the first set of exposed areas 42. The other way is to replace the photomask 30 with a second photomask (not shown) over the photoresist layer 40, instead of shifting the photomask 30. The second photomask (not shown) has a number of transparent portions forming a pattern, which are arranged at positions correspondingly interleaving the first set of exposed areas 42.

After that, the exposure light is turned on again to perform the second exposure process, which projects and transfers the transparent pattern 32 of the photomask 30 (or the pattern of the second photomask) onto the spaces between the first set of exposed areas 42 on the photoresist layer 40. The shaded areas 44 represent the second set of exposed areas corresponding to the pattern 32 on the shifted photomask 30 (or the pattern on the second photomask).

As a result of the double-exposure process, a doubled number (or density) of the transparent portions 32 of the photomask 30 is transferred onto the photoresist layer 40. Each of the exposed areas 42, 44 is now separated from adjacent exposed areas by a distance C, where C=(B−A)/2, which is significantly less than the space B defined on the photomask 30. Accordingly, a doubled density of exposed areas 42, 44 is formed on the photoresist layer 40.

In subsequent steps, the photoresist layer 40 is developed. If the photoresist layer 40 is of a negative conductivity type, the exposed part of the photoresist layer will remain on the wafer and the unexposed part will be removed after development. If the photoresist layer 40 is of a positive conductivity type, the unexposed part of the photoresist layer will remain on the wafer and the exposed part will be removed. The development process is a conventional technique, and therefore description thereof will not be further detailed.

The remaining portions of the photoresist layer 40 are used as a mask that defines the positions, shapes, and sizes of a plurality of metallization layers in the subsequent etching process. If the photoresist layer 40 is of a negative conductivity type, the remaining portions define a plurality of circuit elements such as metallization layers having a reduced spacing of C therebetween. If the photoresist layer 40 is of a positive conductivity type, the remaining portions define a plurality of circuit elements having a reduced line width of C.

SECOND EMBODIMENT

The second embodiment of the invention, which is another photolithographic technique which can be used to define a plurality of circuit elements with a reduced line width or space, is described below with reference to FIG. 3 and FIG. 4B. In this embodiment, the same photomask 30 of FIG. 3, which includes transparent portions having a width of A and which are spaced from adjacent transparent portion (s) by a distance of B, can be used to form a plurality of elongated areas on the photoresist layer 40 with a reduced inter-area spacing C, where C<B, as illustrated in FIG. 4B.

In this embodiment, the first exposure process is similar to that of the first embodiment, in which the photomask 30 is used to form a first selected set of exposed areas 42 on the photoresist layer 40. The distance between adjacent exposed areas 42 is B.

In accordance with the invention, there are two ways to perform the second exposure process. One way is to shift the photomask 30 downwards by a predetermined displacement to a position allowing the transparent portions 32 thereon to overlap part of the first set of exposed areas 42, as illustrated in FIG. 4B. The other way is to replace the original photomask 30 with a second photomask (not shown) over the photoresist layer 40, instead of shifting the photomask 30. The second photomask (not shown) has a corresponding number of transparent portions forming a pattern which are arranged at positions overlapping part of the first set of exposed areas 42.

After that, the exposure light is turned on again to perform the second exposure process, which projects and transfers the transparent pattern 32 of the photomask 30 (or the pattern of the second photomask) onto the wafer at positions overlapping part of the first set of exposed areas 42. The shaded areas 44 represent the second set of exposed areas corresponding to the pattern 32 on the shifted photomask 30 (or the pattern on the second photomask).

As a result of the double-exposure process, the space between adjacent exposed areas (42, and 44 in combination) is reduced from B, which is defined on the photomask 30, to C, as illustrated in FIG. 4B.

The subsequent steps involve development of the photoresist layer 40 and etching of the layers underlying the photoresist layer 40 so as to form the desired circuit elements. These steps are all conventional and are the same as those in the first embodiment, and therefore description thereof will not be detailed.

The remaining portions of the photoresist layer 40 are used as a mask that defines the positions, shapes, and sizes of a plurality of metallization layers in the subsequent etching process. If the photoresist layer 40 is of a negative conductivity type, the remaining portions define a plurality of circuit elements such as metallization layers having a reduced spacing of C therebetween. If the photoresist layer 40 is of a positive conductivity type, the remaining portions define a plurality of circuit elements having a reduced line width of C.

The foregoing embodiments both allow the circuit elements to be formed with a reduced line width or inter-element spacing. Through experiments, the minimum achievable line width or space has been found to be as small as about 0.8 $\mu$m. Compared to the minimum width of 4 $\mu$m achievable by conventional techniques, the photolithographic process according to the invention is a significant improvement over the prior art.

Figure 1:
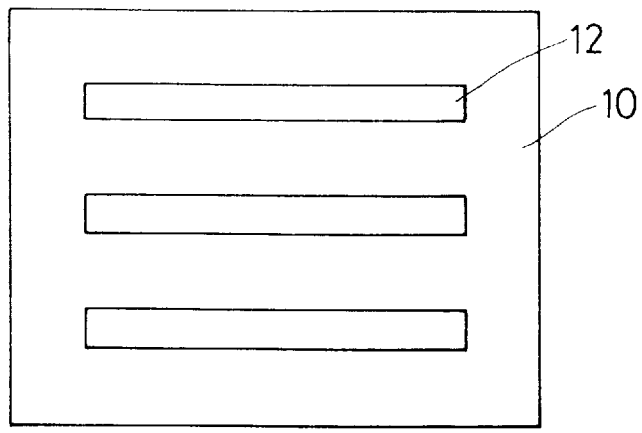
FIG. 1 is a plan view of a photomask.
Figure 2:
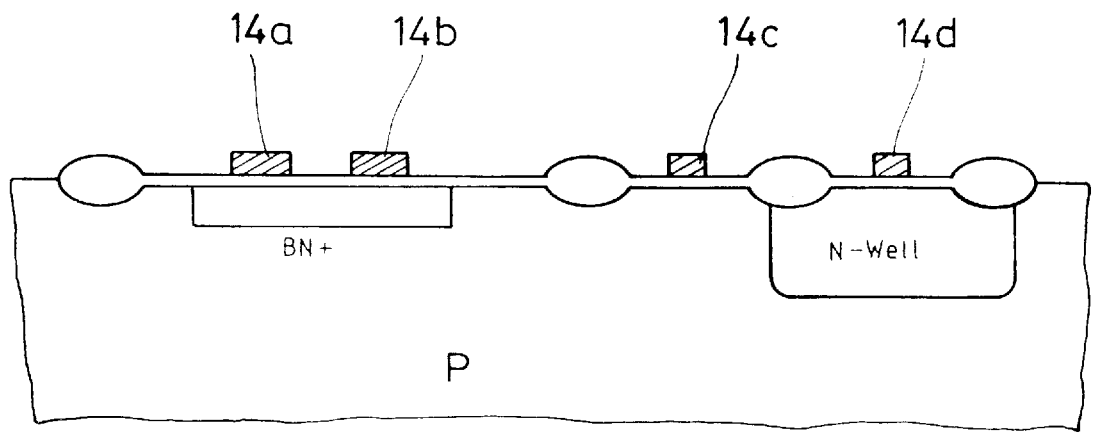
FIG. 2 is a schematic sectional diagram of a ROM chip after mask programming by a conventional photolithographic process.
Figure 5:
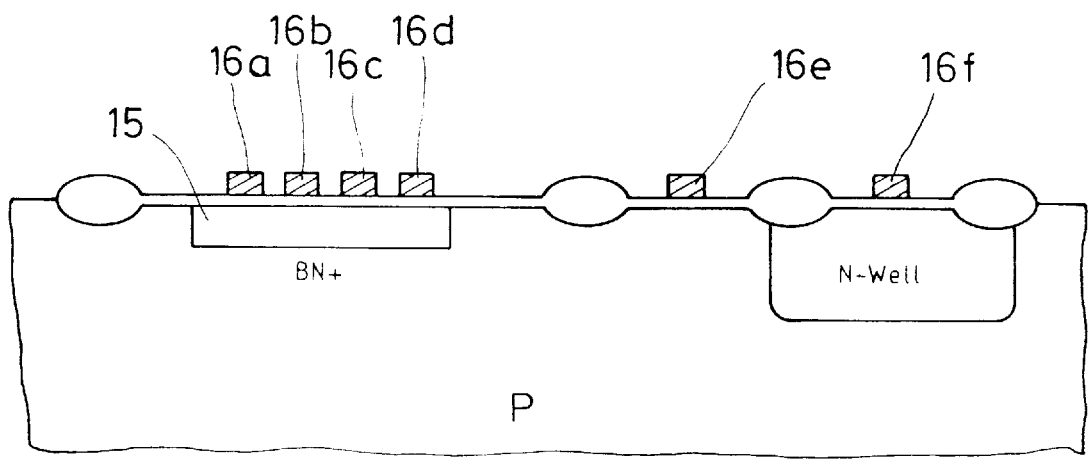
FIG. 5 is a schematic sectional diagram of a ROM chip after mask programming by the photolithographic process according to the invention.

As shown in FIG. 5, the photolithographic process according to the invention can be used to form a greater number (or density) of metallization layers 16a, 16b, 16c, 16d, 16e, 16f on the wafer. Compared to the wafer of FIG. 2, it can be seen that four metallization layers, i.e., 16a, 16b, 16c, and 16d, instead of two (14a, 14b in FIG. 2), can be formed on the BN$^+$area 15 in the wafer.

The invention has been described using exemplary preferred embodiments. However, it is to be understood that the scope of the invention is not limited to the disclosed preferred embodiments. To the contrary, it is intended to cover various modifications and similar arrangements. The scope of the claims should therefore be accorded the broadest interpretation so as to encompass all such modifications and similar arrangements.

What is claimed is:

1. A photolithographic process for defining a plurality of circuit elements on an IC chip, comprising the steps of:

(1) forming a photoresist layer over the IC chip;

(2) covering the photoresist layer with a first photomask, wherein the first photomask is an opaque sheet having a first plurality of transparent portions forming a pattern thereon;

(3) performing a first exposure process on the photoresist layer by illuminating the photoresist layer through the first photomask so as to expose a first selected set of areas on the photoresist layer;

(4) replacing the first photomask with a second photomask, the second photomask having a second plurality of transparent portions forming a pattern, the transparent portions arranged in positions interleaving with the first selected exposed areas on the photoresist layer such that the transparent portions and the first selected exposed areas do not overlap;

(5) performing a second exposure process on the photoresist layer by illuminating the photoresist layer through the second photomask so as to expose a second selected set of areas on the photoresist layer, wherein the first and second selected sets of exposed areas on the photoresist layer in combination form a layout for the plurality of circuit elements to be defined on the IC chip; and (6) developing the photoresist layer.

2. The photolithographic process of claim 1, wherein the photoresist layer is a negative photoresist, and the first and second selected sets of exposed areas of the photoresist layer remain on the IC chip after said step (6) is completed.

3. The photolithographic process of claim 1, wherein the photoresist layer is a positive photoresist, and the first and second selected sets of exposed areas of the photoresist layer are removed from the IC chip during said step (6).

4. A photolithographic process for defining a plurality of circuit elements on an IC chip, comprising the steps of:

(1) forming a photoresist layer over the IC chip;

(2) covering the photoresist layer with a photomask, wherein the photomask is an opaque sheet having a plurality of transparent portions forming a pattern thereon;

(3) performing a first exposure process on the photoresist layer by illuminating the photoresist layer through the photomask, so as to expose a first selected set of areas on the photoresist layer;

(4) shifting the photomask to a predetermined position such that the transparent portions of the photomask interleave with and do not overlap the first selected exposed areas on the photoresist layer;

(5) performing a second exposure process on the photoresist layer by illuminating the photoresist layer through the photomask so as to expose a second selected set of areas on the photoresist layer, the second selected set of areas overlapping the first selected set of exposed areas, wherein the first and second selected sets of exposed areas on the photoresist layer in combination form a layout for the plurality of circuit elements to be defined on the IC chip; and (6) developing the photoresist layer.

5. The photolithographic process of claim 4, wherein the photoresist layer is a negative photoresist, and the first and second selected sets of exposed areas of the photoresist layer remain on the IC chip after said step (6) is completed.

6. The photolithographic process of claim 4, wherein the photoresist layer is a positive photoresist, and the first and second selected sets of exposed areas of the photoresist layer are removed from the IC chip during said step (6).

* * * * *